(12) United States Patent
Goodwin

(10) Patent No.: US 11,205,435 B2
(45) Date of Patent: Dec. 21, 2021

(54) SPATIAL AUDIO SIGNAL ENCODER

(71) Applicant: DTS, Inc., Calabasas, CA (US)

(72) Inventor: Michael M. Goodwin, Scotts Valley, CA (US)

(73) Assignee: DTS, Inc., Calabasas, CA (US)

( * ) Notice: Subject to any disclaimer, the term of this patent is extended or adjusted under 35 U.S.C. 154(b) by 76 days.

(21) Appl. No.: 16/543,343

(22) Filed: Aug. 16, 2019

(65) Prior Publication Data

US 2020/0058310 A1 Feb. 20, 2020

Related U.S. Application Data

(60) Provisional application No. 62/719,427, filed on Aug. 17, 2018.

(51) Int. Cl.
*G10L 19/00* (2013.01)
*H04R 5/04* (2006.01)
(Continued)

(52) U.S. Cl.
CPC ........... *G10L 19/00* (2013.01); *H03M 7/6005* (2013.01); *H03M 7/6011* (2013.01);
(Continued)

(58) Field of Classification Search
CPC ..... G10L 19/008; G10L 19/00; G10L 19/167; G10L 2019/0001; H04R 3/005;
(Continued)

(56) References Cited

U.S. PATENT DOCUMENTS 8,712,061 B2    4/2014   Jot et al.
9,240,021 B2    1/2016   Rodriguez
(Continued)

FOREIGN PATENT DOCUMENTS

EP            3324406 A1    5/2018
WO   WO-2020037280 A1    2/2020
(Continued)

OTHER PUBLICATIONS

"International Application Serial No. PCT/US2019/046936, International Search Report dated Nov. 8, 2019", 2 pgs.
(Continued)

*Primary Examiner* — Yogeshkumar Patel
(74) *Attorney, Agent, or Firm* — Schwegman Lundberg & Woessner, P.A.

(57) ABSTRACT

A method to encode audio signals is provided for use with an audio capture device that includes multiple microphones having a spatial arrangement on the device, a method to encode audio signals comprising: receiving multiple microphone signals corresponding to the multiple microphones; determining a number and directions of arrival of directional audio sources represented in the one or more microphone signals; determining one of an active microphone signal component and a passive microphone signal component, based upon the determined number and directions of arrival; determining the other of the active microphone signal component and the passive microphone signal component, based upon the determined one of the active input spatial audio signal component and the passive input spatial audio signal component; encoding the active microphone signal component; encoding the passive microphone signal component.

26 Claims, 6 Drawing Sheets

(51) Int. Cl.
 H04R 5/027 (2006.01)
 H03M 7/30 (2006.01)
(52) U.S. Cl.
 CPC .............. *H04R 5/027* (2013.01); *H04R 5/04* (2013.01); *G10L 2019/0001* (2013.01); *H04R 2430/20* (2013.01)
(58) Field of Classification Search
 CPC .......... H04R 5/04; H04R 5/027; H04R 1/406; H04R 5/02; H04R 2430/20; H04S 7/301; H04S 2420/11; H04S 2400/15; H04S 2420/03; H04S 2420/07; H04S 3/008; H03M 7/6011; H03M 7/6005
 See application file for complete search history.

(56) References Cited

U.S. PATENT DOCUMENTS

| | | | |
|---|---|---|---|
| 9,271,081 | B2 | 2/2016 | Corteel et al. |
| 9,532,158 | B2 | 12/2016 | Lando et al. |
| 9,609,452 | B2 | 3/2017 | Peters et al. |
| 9,826,328 | B2 | 11/2017 | Mehta et al. |
| 9,973,874 | B2 | 5/2018 | Edward et al. |
| 10,796,704 | B2 | 10/2020 | Goodwin et al. |
| 2008/0205676 | A1 | 8/2008 | Merimaa et al. |
| 2008/0232617 | A1* | 9/2008 | Goodwin ............... H04S 3/008 381/307 |
| 2009/0028347 | A1 | 1/2009 | Duraiswami et al. |
| 2009/0092259 | A1 | 4/2009 | Jot et al. |
| 2012/0214515 | A1 | 8/2012 | Davis et al. |
| 2012/0288114 | A1 | 11/2012 | Duraiswami et al. |
| 2013/0148812 | A1 | 6/2013 | Corteel et al. |
| 2013/0208823 | A1* | 8/2013 | Raleigh ................ H04L 1/0041 375/295 |
| 2014/0350944 | A1 | 11/2014 | Jot et al. |
| 2015/0011194 | A1 | 1/2015 | Rodriguez |
| 2015/0208190 | A1 | 7/2015 | Hooks et al. |
| 2015/0271620 | A1 | 9/2015 | Lando et al. |
| 2015/0380002 | A1 | 12/2015 | Uhle et al. |
| 2016/0093311 | A1 | 3/2016 | Kim et al. |
| 2016/0227337 | A1* | 8/2016 | Goodwin ................ H04R 1/32 |
| 2016/0227340 | A1 | 8/2016 | Peters |
| 2017/0366912 | A1 | 12/2017 | Stein et al. |
| 2017/0366914 | A1 | 12/2017 | Stein et al. |
| 2018/0020310 | A1 | 1/2018 | Crocket et al. |
| 2018/0077511 | A1 | 3/2018 | Mehta |
| 2020/0058311 | A1 | 2/2020 | Goodwin et al. |
| 2021/0020183 | A1 | 1/2021 | Goodwin et al. |

FOREIGN PATENT DOCUMENTS

| | | |
|---|---|---|
| WO | WO-2020037282 A1 | 2/2020 |
| WO | WO-2020247033 A1 | 12/2020 |

OTHER PUBLICATIONS

"International Application Serial No. PCT/US2019/046936, Written Opinion mdated Nov. 8, 2019", 10 pgs.
"International Application Serial No. PCT/US2019/046938, International Search Report dated Nov. 7, 2019", 2 pgs.
"International Application Serial No. PCT/US2019/046938, Written Opinion dated Nov. 7, 2019", 11 pgs.
Daniel, Jerome, et al., "Further Investigations of High Order Ambisonics and Wavefield Synthesis for Holophonic Sound Imaging", Audio Engineering Society Convention Paper 5788, presented at the AES 114th Convention, (2003), 18 pgs.
Heller, Aaron, et al., "Is My Decoder Ambisonic?", 25th Convention of the Audio Engineering Society, (2008), 1-27.
Hwang, H K, et al., "Direction of Arrival Estimation using a Root-MUSIC Algorithm", Proceedings of the International MultiConference of Engineers and Computer Scientists, vol. II, (2008), 4 pgs.
Parra, Lucas, "Least Squares Frequency-Invariant Beamforming", IEEE Workshop on Applications of Signal Processing to Audio and Acoustics, (2005), 102-105.
Rife, D., et al., "Transfer-Function Measurement with Maximum-Length Sequences", J. Audio Eng. Soc., 37(6), (1989), 419-444.
Roy, Richard, et al., "ESPRIT-estimation of signal parameters via rotational invariance techniques", IEEE Transactions on Acoustics, Speech, and Signal Processing, 37(7), (1989), 984-995.
Thiergart, O, "Flexible Multi-Microphone Acquisition and Processing of Spatial Sound Using Parametric Sound Field Representations (Ph.D. thesis)", Fredrich-Alexander-Universitat Erlangen-Nurnberg, (2015), 253 pgs.
Han, Keyong, et al., "Improved Source Number Detection and Direction Estimation With Nested Arrays and ULAs Using Jackkni?ng", EEE Transactions on Signal Processing, vol. 61, No. 23, (2013), 6118-6128.
Politis, Archontis, et al., "COMPASS: Coding and Multidirectional arameterization of Ambisonic Sound Scenes", IEEE, (Apr. 2018), 5 pgs.
Schmidt, R. O., "Multiple Emitter Location and Signal Parameter Estimation", IEEE Transactions on Antennas and Propagation, vol. AP-34, No. 3, (1986), 276-280.
Thiergart, Oliver, et al., "Robust 3D Sound Capturing with Planar Microphone Arrays Using Directional Audio Coding (Convention Paper 9866)", Presented at the 143rd Convention for the Audio Engineering Society, (2017), 10 pgs.
Zhao, Shengkui, et al., "3D Binaural Audio Capture and Reproduction Using a Miniature Microphone Array", Proc. of the 15th Int. Conference on Digital Audio Effects (DAFx-12), (2012), 4 pgs.
"U.S. Appl. No. 16/543,083, Non Final Office Action dated Mar. 3, 2020", 21 pgs.
"U.S. Appl. No. 16/543,083, Notice of Allowance dated Jun. 19, 2020", 13 pgs.
"U.S. Appl. No. 16/543,083, Response filed Jun. 3, 2020 to Non Final Office Action dated Mar. 3, 2020", 20 pgs.
"International Application Serial No. PCT/US2020/018447, International Search Report dated May 13, 2020", 5 pgs.
"International Application Serial No. PCT/US2020/018447, Written Opinion mailed May 13, 2020", 8 pgs.
Nils, Peters, et al., "Scene-based Audio implemented with Higher Order Ambisonics (Hoa)", SMPTE 2015 Annual Technical Conference & Exhibition, (Oct. 26, 2015).
U.S. Appl. No. 16/543,083, filed Aug. 16, 2019, Spatial Aufio Signal Decoder.
"U.S. Appl. No. 17/061,897, Preliminary Amendment filed Feb. 5, 2021", 8 pgs.
"International Application Serial No. PCT/US2019/046936, International Preliminary Report on Patentability dated Mar. 4, 2021", 12 pgs.
"International Application Serial No. PCT/US2019/046938, International Preliminary Report on Patentability dated Mar. 4, 2021", 13 pgs.

* cited by examiner

INPUT FORMAT $$\vec{x} = \sum_n \vec{g}(\Omega_n) s_n + \vec{v}$$

$$\vec{g}(\Omega_n) = \begin{bmatrix} G_{10}(\Omega_n) \\ G_{20}(\Omega_n) \\ \vdots \\ G_{M0}(\Omega_n) \end{bmatrix}$$

B-FORMAT TARGET $$\vec{b} = \sum_n \vec{d}(\Omega_n) s_n + \vec{u}_0$$

$$\vec{d}(\Omega_n) = \begin{bmatrix} \frac{1}{\sqrt{2}} \\ \cos\theta_n \cos\Phi_n \\ \sin\theta_n \cos\Phi_n \\ \sin\Phi_n \end{bmatrix}$$

SPATIAL AUDIO SIGNAL ENCODER

CLAIM OF PRIORITY

This patent application claims priority to U.S. Patent Application No. 62/719,427, filed on Aug. 17, 2018.

BACKGROUND

With ambisonic formats becoming more common for spatial audio applications, it is of growing interest to facilitate practical ambisonic capture of live audio scenes with consumer devices so that everyday users can generate spatial audio recordings that are compatible with ambisonic distribution, modification, and rendering systems. Recent work in the literature has explored the use of compact microphone arrays for spatial capture. For example, for direct binaural reproduction of the captured audio, see, Zhao, et al., Robust 3D Binaural Audio Capture and Reproduction Using a Miniature Microphone Array, Proc. Intl Conf on Digital Audio Effects (DAFX), 2102. For example, for parametric spatial audio coding, see Thiergart et al., Robust 3D Sound Capturing with Planar Microphone Arrays Using Directional Audio Coding, Proc. of the AES $143^{rd}$ Intl. Conv., 2017; and Thiergart et al., Flexible Multi-Microphone Acquisition and Processing of Spatial Sound Using Parametric Sound Field Representation, Ph.D. thesis, Friedrich-Alexander-Universitat Erlangen-Nurnberg, 2015. There exists a need for an approach for ambisonic capture on consumer devices that addresses the practical constraints inherent in such devices, in particular support for a flexible number and arrangement of microphones.

SUMMARY

In one aspect, an audio signal encoder is provided for use with an audio capture device that includes multiple microphones having a spatial arrangement on the device. The audio signal encoder includes a processor and a non-transitory computer readable medium operably coupled thereto, the non-transitory computer readable medium comprising a plurality of instructions stored in association therewith that are accessible to, and executable by, the processor. The plurality of instructions include instructions that, when executed, determine a number and directions of arrival of directional audio sources represented in the one or more microphone signals having the microphone spatial format. Instructions are included that when executed, determine one of an active microphone signal component and a passive microphone signal component, based upon the determined number and directions of arrival of the audio sources represented in the one or more microphone signals having the microphone spatial format. Instructions are included that, when executed, determine the other of the active microphone signal component and the passive microphone signal component, based upon the determined one of the active spatial audio input signal component and the passive spatial audio input signal component. Instructions are included that, when executed, encode the active microphone signal component to a first output signal having a first spatial output format. Instructions are included that, when executed, encode the passive microphone signal component to a second output signal having a second spatial output format.

In another aspect, a method to encode audio signals is provided for use with an audio capture device that includes multiple microphones having a spatial arrangement on the device. The method includes receiving multiple microphone signals corresponding to the multiple microphones. A number and directions of arrival are determined for the directional audio sources represented in the one or more microphone signals having the microphone spatial format. One of an active microphone signal component and a passive microphone signal component is determined based upon the determined number and directions of arrival of the audio sources represented in the one or more microphone signals having the microphone spatial format. The other of the active microphone signal component and the passive microphone signal component is determined, based upon the determined one of the active spatial audio input signal component and the passive spatial audio input signal component. The active microphone signal component is encoded to a first output signal having a first spatial output format. The passive microphone signal component is encoded to a second output signal having a second spatial output format.

BRIEF DESCRIPTION OF DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Terminology

The terms spatial encoding, spatial coding, or spatial audio coding refer to representing a sound scene or soundfield in terms of audio signals and side information.

The terms spatial format or spatial audio format or spatial audio signal refer to audio signals and side information that represent a sound scene or soundfield; the side information may entail a definition of the format, such as directional characteristics corresponding to each of the audio channels in the format, and in some cases, may also include signal-dependent information such as the directions of sources present in the audio signals. A spatial audio signal includes one or more constituents that may be referred to as audio signal components, or audio channels. In some examples, a spatial audio signal may be referred to as an audio signal in a spatial format.

The terms spatial encoding or spatial audio encoding refer to processing an input audio signal received at a microphone array to generate an encoded spatial audio signal in a specified spatial audio format.

Audio Signal Encoder

Figure 1:
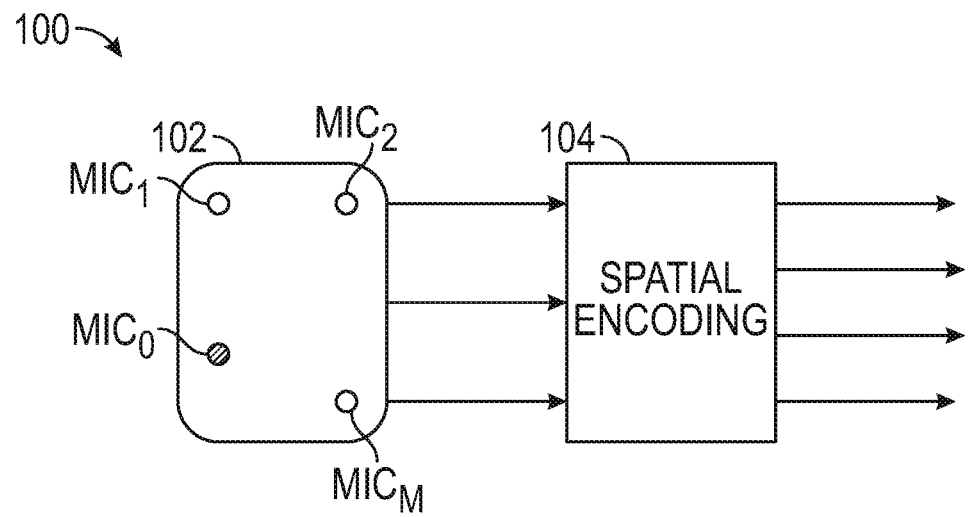
FIG. 1 is an illustrative generalized block diagram representing an example audio signal encoder.

FIG. 1 is an illustrative generalized block diagram representing an example audio signal encoder 100. The audio signal encoder (which may also be referred to as a 'beamformer') includes an example audio capture device 102 that includes multiple microphones $MIC_1$-$MIC_M$ and an example spatial encoder 104. The example audio capture device 104 includes M audio capture microphones $MIC_1$-$MIC_M$ and a reference microphone $MIC_0$. In an alternative example audio capture device, the reference microphone $MIC_0$ may correspond to one of the audio capture microphones $MIC_1$-$MIC_M$. In an alternative example audio capture device, the reference microphone $MIC_0$ can comprise a virtual microphone having a beam pattern corresponding to a combination of one or more of the audio capture microphones $MIC_1$-$MIC_M$. In response to sound from an audio sound source, the multiple microphones $MIC_1$-$MIC_M$ produce corresponding audio signals $x_1$-$x_M$ and the reference microphone $MIC_0$ produces a reference audio signal $x_0$. The example spatial encoder 104 converts the microphone audio signals $x_1$-$x_M$ to a spatial audio signal in a prescribed spatial format. More particularly, an example spatial encoder 104 converts the microphone audio signals $x_1$-$x_M$ to ambisonic B-format signals.

An example encoder 104 is configured to map input microphone signals at each of multiple different frequencies to encoded spatial audio signal components in a spatial format at each of the different frequencies. As described more fully below with refence to FIG. 6, one example encoder is configured to include an example active signal encoder 608 (denoted in FIG. 6 as an active beamformer), and an example passive signal encoder 610 (denoted in FIG. 6 as a passive beamformer). For each frequency, the example encoder includes one or more mapping operations to map M microphone signals to N encoded spatial audio output signal components. Each different frequency can have a different mapping. In the example generalized encoder 106, the value of N is four since the encoded spatial format is the first-order ambisonics B-format, which has four signal components.

Ambisonics is a technique to represent a soundfield by capturing/encoding a fixed set of signals corresponding to a single point in the soundfield. Each of the fixed set of signals in an ambisonic representation has a defined directivity pattern. The directivity patterns are designed such that ambisonic-encoded signals carry directional information for all of the sounds in an entire soundfield. An ambisonic encoder (not shown) encodes a soundfield in an ambisonic format. An ambisonic format is independent from the specific loudspeaker layout which may be used to reconstruct the encoded soundfield. An ambisonic decoder decodes ambisonic format signals for a specific loudspeaker layout. Eric Benjamin, Richard Lee, and Aaron Heller, Is My Decoder Ambisonic?, 125th AES Convention, San Francisco 2008, provides a general explanation of ambisonics.

Signal and Scene Model

Figure 2:
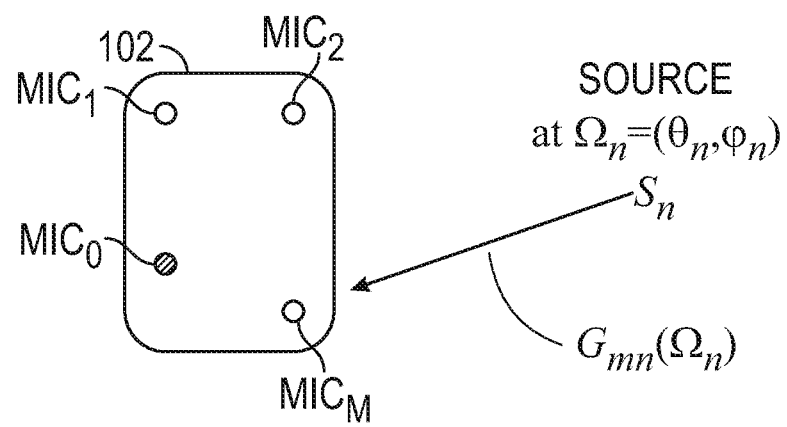
FIG. 2 is an illustrative drawing representing an example source signal at a spatial direction incident upon the example audio capture device of FIG. 1.

FIG. 2 is an illustrative drawing representing an example source signal $S_n$ at a spatial direction $\Omega_n = (\theta_n, \varphi_n)$ incident upon the example audio capture device 102 of FIG. 1. The spatial encoder of FIG. 1 is operable with an audio capture device 102 having microphones at unconstrained and unknown locations on the capture device. That is, the microphone geometry is not known a priori to the spatial encoder 104. However, an offline calibration process described more fully below can be undertaken to estimate parameters that in effect describe the geometrical properties of the capture device and its constituent microphones.

In a sound scene including of a combination of point sources and diffuse sources, the microphone signals received by the capture device 102 can be modeled in the time-frequency domain as $$x_m = \Sigma_n G_{mn}(\Omega_n) s_n + v_m \qquad (1)$$

where $x_m$ denotes a time-frequency representation of the m-th microphone signal, $s_n$ denotes a time-frequency point-source signal at the spatial direction $\Omega_n$, which corresponds to an angle pair consisting of an azimuth angle $\theta_n$ and an elevation angle $\varphi_n$ with respect to a reference point for the measurement; the $\Omega_n$ notation is used for simplicity. The formulation $G_{mn}(\Omega_n)$ represents a transfer function from the n-th source to the m-th microphone, which is assumed to be a function of the angular location of the source. The component $v_m$ is a time-frequency signal comprising the aggregate of all diffuse sources in the m-th microphone signal. For the sake of simplicity, frequency and time indexes have been omitted from the notation for the signals $x_m$, $s_n$, and $v_m$; also, the frequency dependence has been omitted for the spatial response $G_{mn}(\Omega_n)$.

The response measurement reference point mentioned in the preceding paragraph is important to consider since the microphones $MIC_1$-$MIC_M$ may not necessarily be coincident. The microphone signals captured by the microphones of the capture can be modeled with respect to the reference microphone $MIC_0$ as $$x_m = \Sigma_n G_{m0}(\Omega_n) G_{0n}(\Omega_n) s_n + v_m \qquad (2)$$

where the spatial response has been decomposed into a response from the source n to the reference point 0 and a response from the reference 0 to microphone m.

An example capture device includes an omnidirectional source microphone $MIC_0$ (perhaps virtual). Thus, the model can be simplified in that it can be expressed solely in terms of the responses from the reference to the respective microphones:

$$x_m = \Sigma_n G_{m0}(\Omega_n) s_n + v_m \qquad (3)$$

This can be expressed in vector form as $$\vec{x} = \sum_n \vec{g}(\Omega_n) s_n + \vec{v} \qquad (4)$$

where $$\vec{g}(\Omega_n) = \begin{bmatrix} G_{10}(\Omega_n) \\ G_{20}(\Omega_n) \\ \vdots \\ G_{M0}(\Omega_n) \end{bmatrix} \qquad (5)$$

is a steering vector for the capture device microphone array for the direction corresponding to $\Omega_n$ at a given frequency.

Figures 3, 4:
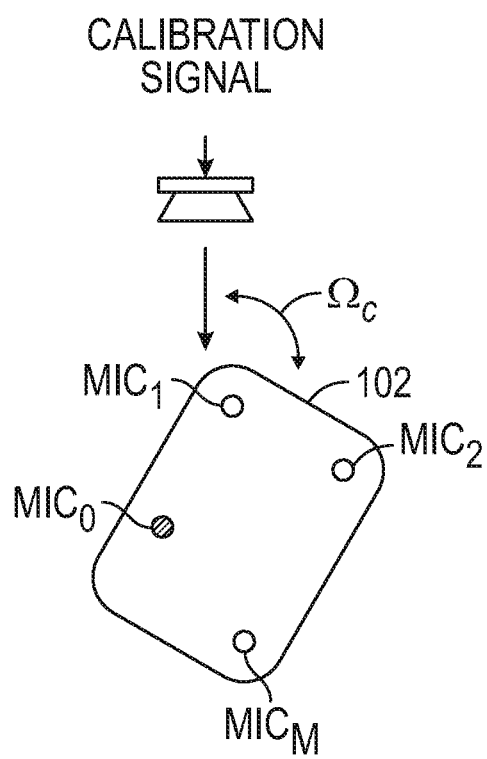
FIG. 3 is an illustrative drawing representing a simplified example conversion, by the encoder of FIG. 1, of input microphone signals to B-format signals.
FIG. 4 is an illustrative drawing representing an arrangement for calibration of the capture device of FIG. 1 using a sound signal source.

FIG. 3 is an illustrative drawing representing a simplified example conversion, by the decoder of FIG. 1, of input microphone signals to B-format signals. The target B-format signals can be expressed as $$\vec{y} = \Sigma_n \vec{d}(\Omega_n) s_n + \vec{u}_0 \qquad (6)$$

where the vector $\vec{d}(\Omega)$ denotes the first-order ambisonic encoding vector $$\vec{d}(\Omega) = \begin{bmatrix} \frac{1}{\sqrt{2}} \\ \cos\theta\cos\phi \\ \sin\theta\cos\phi \\ \sin\phi \end{bmatrix} \qquad (7)$$

and where $u_0$ denotes a vector of the diffuse content for a B-format capture at the reference location 0. The entries in the ambisonic encoding vector in Eq (7) correspond to the beam patterns of the first-order ambisonic components typically denoted in the literature as W, X, Y, and Z; these are the target patterns for the beamforming process and apparatus described below.

Calibration of Microphone Spatial Responses

The spatial responses of the microphones $MIC_1$-$MIC_M$ of the capture device 102 are characterized according to an example calibration process. Since the microphones are not necessarily coincident (as in an ideal soundfield microphone for ambisonic capture), the spatial response is measured with respect to a common reference microphone $MIC_0$ so that the effects of the relative microphone positions are included in the measurements. For the sake of calibration, the reference $MIC_0$ can be an external microphone, a selected microphone on the device, or a virtual microphone comprising a linear combination of the device microphones, for example.

The example calibration process includes synchronously recording the received microphone signals for a broadband calibration signal, such as a maximum-length sequence, for a set of multiple orientations of the capture device with respect to a calibration signal source. For an example of a calibration process for measuring acoustic transfer functions see, Rife et al., Transfer Function Measurement with Maximum-Length Sequences, J. Audio Eng. Soc., 37(6), pp. 419-444, 1989.

FIG. 4 is an illustrative drawing representing an arrangement for calibration of the capture device 102 of FIG. 1 using a sound signal source. The capture device 102 is oriented at an example capture orientation relative to the source. If a reference microphone $MIC_0$ is used, for example, then a reference signal is also synchronously captured for the capture orientation. These calibration measurements are analyzed, for example by converting the respective captured microphone signals and the reference microphone signal to frequency-domain representations and then formulating the respective relative transfer functions as ratios between the frequency-domain representation of the respective capture microphone signal and the frequency-domain representation of the reference microphone signal, to derive the microphone spatial responses $G_{m0}(f; \Omega_j)$, namely the spatial frequency response from the reference microphone $MIC_0$ to microphone m at frequency f for direction $\Omega_j$ corresponding to an azimuth angle $\theta_j$ and an elevation angle $\varphi_j$; the joint angle notation is again adopted for simplicity. The calibration results in a per-frequency data matrix $$\Gamma = \begin{bmatrix} G_{10}(\Omega_1) & G_{10}(\Omega_2) & \cdots & G_{10}(\Omega_C) \\ G_{20}(\Omega_1) & G_{20}(\Omega_2) & \cdots & G_{20}(\Omega_C) \\ \vdots & \vdots & \ddots & \vdots \\ G_{M0}(\Omega_1) & G_{M0}(\Omega_2) & \cdots & G_{M0}(\Omega_C) \end{bmatrix}^T \qquad (8)$$

where the dependence on frequency has been omitted from the notation for simplicity. M is the number of microphones and C is the number of angle pairs for which the calibration is carried out. Note that the subscript of $\Omega$ refers to a model component in some equations such as (1) whereas in other equations such as (8) it refers to an index into the calibration matrix or an element of the candidate direction set (to be explained below).

Figures 5, 6:
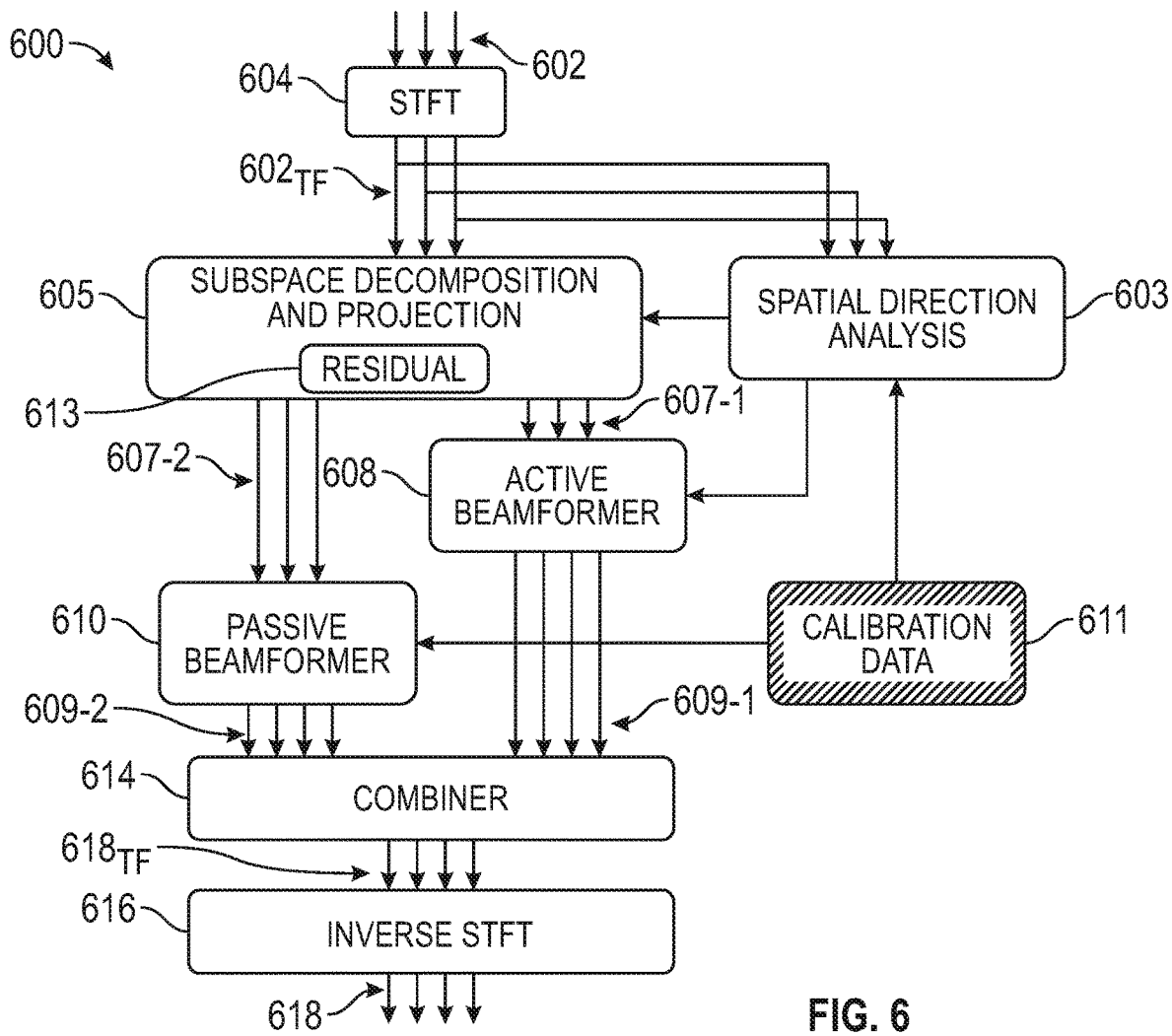
FIG. 5 is an illustrative drawing showing an example calibration data matrix for a single frequency.
FIG. 6 is an illustrative schematic block diagram of an example audio signal encoder system.

FIG. 5 is an illustrative drawing showing an example calibration data matrix for a single frequency f, which is excluded from the notation in the matrix definition. Note the matrix transpose in the definition of the matrix $\Gamma$ in the above equation and in FIG. 5. The c-th row of the matrix $\Gamma$ is the transpose of the capture device's steering vector $\vec{g}(\Omega_c)$ for frequency f and direction $\Omega_c$. The m-th column of $\Gamma$ is a sampling of the directional, or spatial, response of the m-th microphone for frequency f at the angle pairs $\Omega_1, \Omega_2, \ldots, \Omega_c \ldots \Omega_C$.

The calibration thus estimates the spatial response from the reference microphone $MIC_0$ to each microphone $MIC_1$-$MIC_M$ for each direction of source arrival in the set of C angle pairs for which calibration data was measured. It is noted that the calibration does not explicitly estimate the device or array geometry; rather, the geometry is captured implicitly in these spatial response estimates. Furthermore, it is noted that the use of a reference including one or more device microphones removes the effect of external equipment and room geometry on the transfer function measurement since the estimates characterize the relative response between device microphones.

Spatial Audio Encoder System

FIG. 6 is a schematic block diagram of an example audio signal encoder system 600. The encoder system 600 includes a computer system that includes one or more processor devices operatively coupled to one or more non-transitory storage devices that store instructions to configure the processing devices to provide the processing blocks described with reference to FIG. 6. More particularly, the audio signal encoder system 600 includes a time-frequency transformation block 604, a spatial direction analysis block 603, a subspace decomposition and projection block 605, which includes a residual determination block 613, an active encoder block 608, (denoted as an active beamformer) a passive encoder block 610 (denoted as a passive beamformer), a calibration data block 611, a combiner block 614 and an inverse time-frequency transformation block 616. The time-frequency transformation block 604 receives a time-domain input audio microphone signals 602 and converts the input microphone signals to a time-frequency representation 602$_{TF}$. Subsequent processing is carried out in a corresponding time-frequency domain, for instance a short-time Fourier transform (STFT) domain as depicted in FIG. 6. An alternative example audio signal encoder system (not shown) omits the time-frequency transformation block so that subsequent processing is carried out in the time domain. The subspace decomposition and projection block 605 decomposes input audio microphone signals 602$_{TF}$, in the time-frequency domain, to produce active input audio microphone signal components 607-1, and passive input audio microphone signal components 607-2. The active and passive input audio microphone signal components 607-1 and 607-2 add up to the time-frequency input audio microphone signals $602_{TF}$.

The active encoder block 608 transforms the active input audio microphone component 607-1, in the microphone spatial format, to an active spatial audio output signal 609-1 having the active signal output spatial format. As used herein, the term 'active input audio microphone signal' refers to a signal that is received at the active encoder 608. As used herein, the term 'active encoder' refers to an encoder that encodes the input audio microphone signal based upon a spatial directional analysis. An example active encoder block encodes 608 to one of a first order ambisonic (FOA) format, a higher-order ambisonic (HOA) format, or a different prescribed spatial audio format.

The passive encoder block 610 uses the microphone calibration information from the calibration block 611 to transform the passive input audio microphone signal 607-2 in the microphone spatial format to a passive spatial audio output signal 609-2 having the specified passive signal output spatial format. As used herein, the term 'passive input audio microphone signal' refers to a signal that is received at a passive encoder 610. As used herein, the term 'passive encoder' refers to an encoder that encodes the input audio microphone signal without further spatial directional analysis of the passive input audio microphone signal. An example passive encoder block 610 encodes to one of an FOA ambisonic format, an HOA ambisonic format, or to a different prescribed spatial audio format.

The combiner block 614 combines the active spatial audio output signal 609-1 and the passive spatial audio output signal 609-2. In an example audio signal encoder system 600, additional processing of the encoded signals can be carried out before combining the encoded signals components; for instance, different filters can be applied to the active and passive signals. In another example of the audio signal encoder system 600, additional processing of the encoded signals can be carried out after combining the encoded signals; for instance, a filter may be applied for equalization. The inverse time-frequency transformation block 616 converts combined encoder output signals $618_{TF}$ (in time-frequency domain) to time-domain spatial audio signals.

Still referring to FIG. 6, the time-frequency input audio microphone signals $602_{TF}$ are routed to a spatial direction analysis block 603, to a subspace decomposition block 605 and to the residual determination block 613. The direction block 603 provides an estimate 405 of the number and directions of arrival (DOA) of directional audio sources per frequency bin in the input signals $602_{TF}$ based upon the calibration data provided by the calibration block 611. The subspace decomposition block 605 determines the active input audio microphone signal components 607-1 based upon the estimated DOAs 405. More particularly an example subspace determination block 605 determines the active input audio microphone signal components 607-1 by determining microphone steering vectors, which may also be referred to as direction vectors, from among the calibration data that best represent the directional sources in the input microphone signals. A residual determination block 613 determines the passive input audio microphone signal components 607-2 based upon a difference between the received input signal $602_{TF}$ and the active input audio microphone signal components 607-1 determined by the subspace decomposition block 605. In an alternative example decomposition block (not shown), the passive input audio microphone signal is determined first, and the active input audio microphone signals are determined thereafter based upon a difference between the received input signal $602_{TF}$ and the passive input audio microphone signals.

Figure 7:
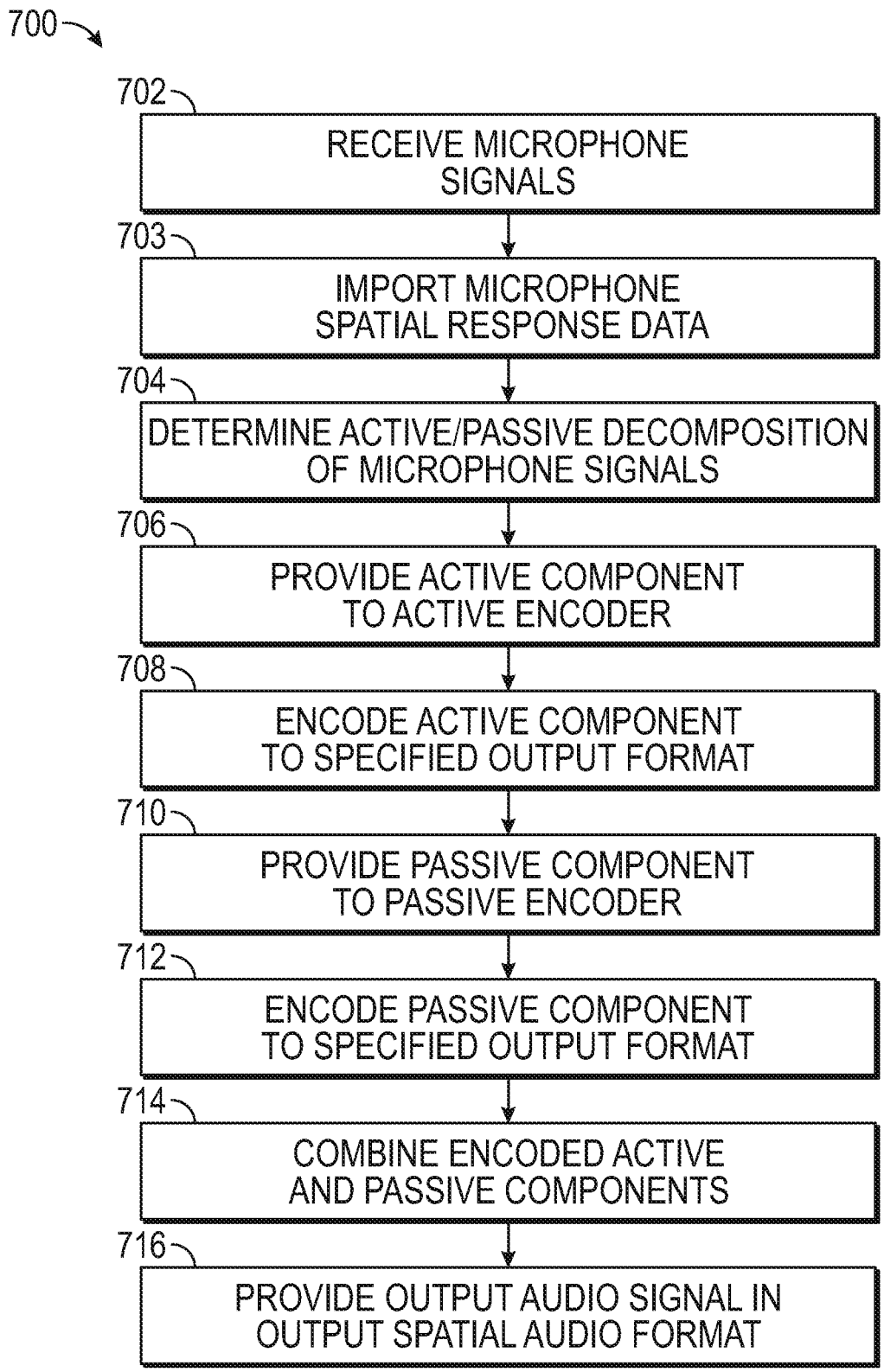
FIG. 7 is an illustrative flow diagram representing an example spatial audio format encoding process.

FIG. 7 is an illustrative flow diagram representing an example spatial audio format encoding process 700. A computer system that includes one or more processor devices operatively couple to one or more non-transitory storage devices store instructions to configure the processing devices to control the blocks of the examples described with reference to FIGS. 1-6 to perform the example spatial audio format decoding process 700. The modules of FIG. 7 correspond to control logic of the one or more processor devices configured according to the instructions. In module 702, microphone signals 602 from multiple microphones are received as input. In some examples, module 702 further comprises transforming the microphone signals to a time-frequency representation, for example using a short-time Fourier transform, which often includes a windowing process. In module 703, the microphone spatial response data from the calibration process is imported for use in both the active and passive encoders. In module 704, the microphone signals in the microphone spatial format are decomposed into active and passive signal components, for example, in accordance with the blocks explained with reference to FIG. 7. In module 706, the active signal component in the microphone spatial format, is provided as input to an active signal encoder. In module 708, the active signal encoder encodes the active signal component to a specified output spatial format. An example module 708 encodes to a first-order ambisonics (FOA) format. An alternate example module 708 encodes to a higher-order ambisonics (HOA) format. Yet another example module encodes to a different prescribed spatial audio format. In module 710, the passive signal component in the microphone spatial format is provided as input to a passive signal encoder. In module 712, the passive signal encoder encodes the passive signal component to a specified output spatial format. Example module 712 encodes to one of an FOA ambisonic format, an HOA ambisonic format, or to a different prescribed spatial audio format. The encoded active signal component and encoded passive signal components are combined in module 714; in some examples, processing such as filtering is carried out in addition to combining. In module 716, the combined active and passive signal encoder outputs are provided as outputs of the encoder system. The output of the encoder system is provided as audio signals in the output spatial audio format. It will be understood that a spatial audio signal typically includes multiple constituent audio signals e.g., W, X, Y, Z constituents for the B-format. In some examples, module 716 further comprises transforming the output audio signals from a time-frequency representation to tune-domain signals, for instance using an inverse short-time Fourier transform, which may include windowing and overlap-add processing.

Active Signal Direction Estimation

The direction block 603 estimates the number and directions of sources in the input audio microphone signals $602_{TF}$. The source directions, which are typically referred to as directions of arrival (DOAs), may correspond to the angular locations of the sources. In one example, the direction block 603 estimates direction vectors corresponding to the DOAs of audio sources by selecting from a codebook of candidate direction vectors. An example codebook includes direction vectors for analyzing the input signals from the calibration data matrix, which comprises a frequency-dependent direction vector codebook. The selection is based in part on the eigenvectors of a spatial correlation matrix in accordance with a multiple signal classification (MUSIC) algorithm for DOA estimation. The eigenvalues of the spatial correlation matrix are used for source counting. See, Schmidt, R. O, "Multiple Emitter Location and Signal Parameter Estimation," IEEE Trans. Antennas Propagation, Vol. AP-34 (March 1986), pp. 276-280 for an explanation of example principles of the MUSIC algorithm. In an example encoder system, the MUSIC algorithm is used to estimate the spatial directions of sound sources represented in the input audio microphone signals. An example system is configured to receive microphone signals; these input microphone signals correspond to an input spatial audio format. The example system is further configured to receive microphone response data, for instance from a calibration process, indicating steering vectors and directional responses corresponding to the microphone spatial format. The MUSIC algorithm codebook includes direction vectors corresponding to defined locations on a virtual sphere. The direction block 603 estimates a number and directions of audio sources in the input microphone signals $602_{TF}$ for each of a number of frequency bins, based upon eigenvalues and eigenvectors of a spatial correlation matrix and codebook directions associated with the virtual sphere in accordance with the MUSIC algorithm.

An example direction block 603 is configured to perform the MUSIC algorithm as follows. The direction block estimates the number and directions of audio sources in the input microphone signals based on direction vectors corresponding to the microphone spatial format, which can be determined based on microphone calibration information from the calibration block 611. As explained above, the microphone calibration information represents the spatial arrangement of the multiple microphones $MIC_1$-$MIC_M$ relative to the reference microphone $MIC_0$. A set of candidate spatial directions is determined. Each spatial direction is specified as an (azimuth, elevation) angle pair corresponding to a point on a virtual sphere. The set of candidates includes a list of such angle pairs. This list of angle pairs may be denoted as $\Omega$; the i-th element of this list may be denoted as $(\theta_i, \varphi_i)$. In some examples, the set of candidate directions can be constructed to have equal resolution in azimuth and elevation. In some examples, the set of candidate directions can be constructed to have variable azimuth resolution based on the elevation angle. In some examples, the density of the candidate distribution can be different in different regions of the sphere. In some examples, the candidate density distribution can be greater at elevation angles within thirty degrees of zero degrees elevation than at elevation angles within 30 degrees of ninety degrees. In some examples, the set of candidate directions can be constructed based on a density of the distribution of directions on a unit sphere. As stated above, in some examples, the set of candidate directions corresponds to the set of directions for which response data is measured in the calibration process.

A codebook of direction vectors corresponding to the set of spatial directions $\Omega$ is established. In some examples, the codebook entries may be alternatively referred to as steering vectors. An example codebook used in the directional analysis of microphone signals consists of vectors determined by a calibration measurement process, for instance the process described above for determining the data matrix $\Gamma$ defined in Eqn. (8). The codebook can be expressed as a matrix where each column is a direction vector (which may be referred to as a steering vector) corresponding to an angle pair $(\theta_i, \varphi_i)$ from the set $\Omega$. In some examples the direction vector codebook may correspond to the transpose of the data matrix defined in Eqn. (8):

$$\Gamma^T = [\vec{g}_1 \ \vec{g}_2 \ \cdots] \tag{9}$$

$$\vec{g}_i = \begin{bmatrix} G_{10}(\Omega_1) \\ G_{20}(\Omega_1) \\ \vdots \\ G_{M0}(\Omega_1) \end{bmatrix} \tag{10}$$

In some examples the direction vector codebook can be a function of frequency; in other words, the steering vector for a certain direction may be different at each frequency.

The spatial correlation matrix of the input microphone signals $602_{TF}$ is estimated. In an example direction block 603, the estimate is determined for individual frequencies at one or more time frames. The spatial correlation matrix quantifies the correlation between respective microphone signals in the microphone spatial format and is defined as, $$R_{xx} = E\{\vec{x}\vec{x}^H\} \tag{11}$$

where $\vec{x}$ is a vector of input signals and the superscript H denotes the Hermitian transpose.

In some examples of the direction block 603, the frequency-domain processing framework estimates the spatial correlation matrix for each bin frequency and time frame. This approach can be formulated as follows:

$$R_{xx}(b,t) = \lambda_b R_{xx}(b,t-1) + (1-\lambda_b)(\vec{x}_k \vec{x}_k^H) \tag{12}$$

where t is a time frame index and where $\vec{x}_k$ is a column vector of input format signal values for frequency bin k at time t.

An eigendecomposition of the spatial correlation matrix is carried out. The eigenvectors and eigenvalues are portioned into signal and noise components (often referred to as subspaces). In one example, the portioning is done based upon applying a threshold to the eigenvalues, with the larger eigenvalues interpreted as signal components and the smaller eigenvalues interpreted as noise components. In one example, the portioning is done based upon applying a threshold to a logarithm of the eigenvalues, with the larger logarithmic values interpreted as signal components and the smaller logarithmic values interpreted as noise components.

An optimality metric is computed for each element of the codebook. An example optimality metric quantifies how orthogonal the codebook element is to the noise eigenvectors. In an example direction block 603, an optimality metric f [i] is formulated as follows:

$$Q = [\vec{q}_1 \ \vec{q}_2 \ \cdots] \tag{13}$$

$$f[i] = \frac{1}{\|Q^H \vec{g}_i\|} \tag{14}$$

where each vector $\vec{q}$ represents an eigenvector of the spatial correlation matrix corresponding to an eigenvalue portioned as a noise component, in other words an eigenvector corresponding to the noise subspace, and where Q represents a matrix of one or more such noise subspace eigenvectors.

Note that the term $Q^H \vec{d}_i$ comprises correlations between the direction vector $\vec{d}_i$ and one or more eigenvectors of the noise subspace. If M is the number of components in the input format and P is the estimated number of sources, then Q may comprise at most M−P such noise subspace eigenvectors. In another example, an optimality metric f [i] is formulated as follows:

$$f[i] = \|Q^H \vec{g}_i\| \tag{15}$$

The extrema in the optimality metric are identified by a search algorithm in accordance with the formulation of the optimality metric. In one example, the extrema identified by the search algorithm may be maxima. In one example, the extrema identified in the search algorithm may be minima. The extrema indicate which codebook elements are most orthogonal to the noise eigenvectors; these correspond to the estimates of the directions of prominent audio sources.

One of the computational costs of a MUSIC-based ambisonics active encoding algorithm is the computation of the optimality metric f [i] for a current input's noise subspace across the entire codebook of possible input source directions for each frequency. The extrema in this metric reveal the best fit of codes to the input microphone signals, namely, the best direction estimates. For spatial audio applications, where directional accuracy is important, the elements in the codebook must sufficiently represent all possible directions in azimuth and elevation, both above and below the ear level. In some examples, the codebook can be constructed to have a specified azimuth angle resolution for each of a set of elevation angles. In some examples, the codebook can be constructed to have a specified size in accordance with computational constraints. In some examples, the elements in the codebook can be configured with certain symmetries to allow for computational simplifications. In some examples, the elements in the codebook can be configured to have angular resolutions in accordance with psychoacoustic considerations. In some examples, as noted earlier, the azimuth and elevation angle sets represented in the direction codebook correspond to the azimuth and elevation angle sets for which calibration measurements were taken in a calibration process. As will be understood by those of ordinary skill in the art, methods other than the MUSIC-based algorithm can be used for estimating the number and direction of sources in the input microphone signals. For instance, an optimality metric can be computed based on the correlation between the input signal vector and the elements of the direction codebook, and the elements with the highest correlation can be selected as the estimated source directions. Such alternative methods are within the scope of the present invention.

Active Signal Subspace Determination

For each of one or more frequency bins, an example subspace decomposition block 605 forms an M×P matrix (G) of vectors as, $$G = [\vec{g}_1 \ \vec{g}_2 \ \dots \ \vec{g}_P] \tag{16}$$

where each column $\vec{g}_p$ of the matrix G is a vector associated with a sound source direction and the input spatial format of the multiple microphones, for example as characterized by the calibration data, where P is the estimated number of sources and M is the number of components in the input format. Referring to FIG. 5, in an example encoder where the input spatial audio format is a microphone spatial format, each column vector of the matrix G may correspond to a direction vector (also referred to as a 'steering' vector) $\vec{g}(\Omega)$ at a particular angle pair associated with an estimated direction of a source. The matrix G is a matrix of estimated source direction vectors.

For each of one or more frequency bins, the example subspace decomposition block 605 determines an active subspace projection matrix $\Phi_A = (G^H G)^{-1} G^H$ which represents a subspace projection to map the input microphone signals onto the subspace defined by the identified source directions for the respective frequency bin.

For each of one or more frequency bins, the example subspace decomposition block 605 determines, for each frequency bin, an active input spatial audio signal vector $\vec{x}_A$ as $$\vec{x}_A = \Phi_A \vec{x} = (G^H G)^{-1} G^H \vec{x} \tag{17}$$

where $\vec{x}$ is a vector that represents the spatial audio input signal 602$_{TF}$ at a particular time and frequency bin and $\vec{x}_A$ is a vector that represents active input spatial audio signal components 607-1 at the same time and frequency bin. Thus, direction estimation and various matrices (projection, encoding, etc) are derived per frequency bin. They are applied to the signal independently for each bin. The subspace decomposition block 605 provides the active input spatial audio components resulting from the active subspace projection to the active spatial audio signal encoder block 608 and to the residual determination block 613.

While the active signal direction estimation and subspace determination have been described as being carried out per frequency bin in a short-time Fourier transform domain, those of ordinary skill in the art will understand that the approaches can be alternatively implemented in frequency bands, for instance as implemented by a filter bank, and that such approaches are within the scope of the present invention.

Residual Determination

The residual determination block 613 determines the passive input microphone signal components 607-2 in the microphone spatial format based upon the determined active input spatial audio signal components 607-1 in the microphone spatial format. More particularly, for each of one or more frequency bins, an example residual determination block 613 determines, for each frequency bin, a passive input spatial audio signal vector $\vec{x}_P$ as a difference (or residual) between an input signal vector $\vec{x}$ and the active input spatial audio signal vector $\vec{x}_A$, represented as $$\vec{x}_P = \vec{x} - \vec{x}_A. \tag{18}$$

In an alternative example decomposition block (not shown), the passive input spatial audio signal component is determined first, and the active input spatial audio signal component is determined thereafter. The alternative approach can use the same MUSIC process. More specifically, the passive component 4 can be determined first and the active component $\vec{x}_A$ can be determined as the residual after subtracting the passive component from the input spatial audio signal. Recalling that $\Phi_A$ denotes the active subspace projection matrix $(G^H G)^{-1} G^H$, some examples may determine the passive component as $\vec{x}_P=(I-\Phi_A)\vec{x}$ and then determine the active component as $\vec{x}_A=\vec{x}-\vec{x}_P$ where I is the M×M identity matrix.

Active Signal Encoder Configuration

The active signal encoder 608 is configured, for each of one or more frequency bins, based upon directions determined by the direction determination block 603 and based upon an active subspace projection matrix determined using the subspace decomposition block 605.

Figure 8:
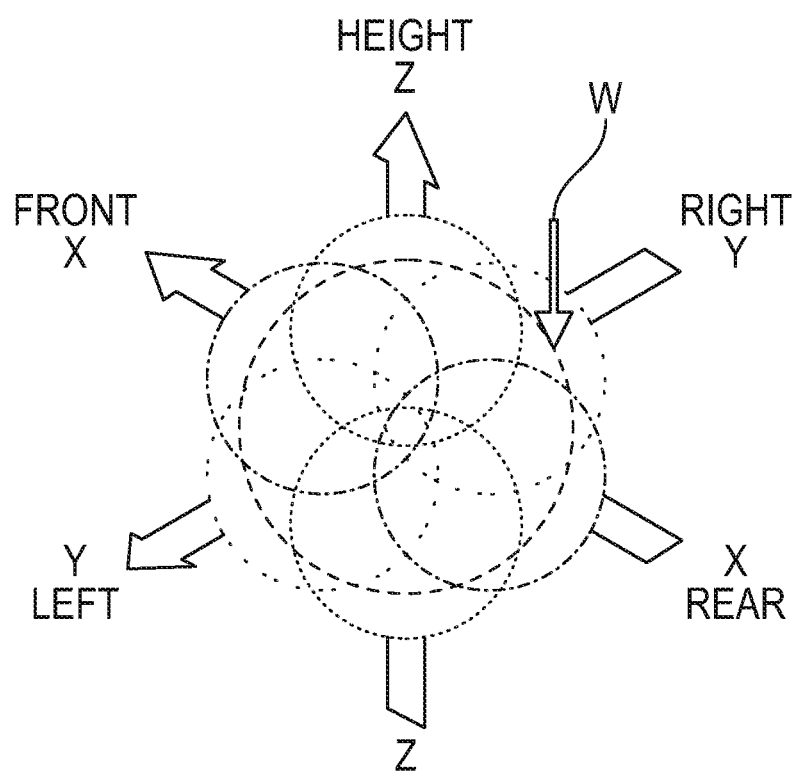
FIG. 8 is an illustrative drawing representing the B-format ambisonic spatial format.

For each of one or more frequency bins, an example active signal encoder 608 is configured according to an active signal encoder matrix, $$H_A D \Phi_A = D(G^H G)^{-1} G^H \qquad (19)$$

where an example N×P matrix $$D=[\vec{d}_1\ \vec{d}_2\ \ldots\ \vec{d}_P] \qquad (20)$$

is formed where each column of the matrix D is a direction vector (or steering vector) associated with a determined source direction and the output spatial audio format. Note that in Eq. (19) the superscript H denotes the Hermitian transpose, which for real matrices is the same as the standard transpose. Each column of the matrix D is a direction vector or steering vector for the output format corresponding to a source direction identified for the input format. N is the number of components in the output format. It should be noted that the matrix $H_A$ is independent of the order of the P columns in the matrices G and D if the ordering is consistent between those two matrices. For the case of FOA encoding, each column of the matrix D corresponds to a first-order ambisonic direction vector of the form $$\vec{d}(\Omega_i) = \begin{bmatrix} \frac{1}{\sqrt{2}} \\ \cos\theta_i \cos\phi_i \\ \sin\theta_i \cos\phi_i \\ \sin\phi_i \end{bmatrix} \qquad (21)$$

where the elements of the direction vector correspond to the W (omnidirectional), X (front/back), Y (left/right), and Z (up/down) channels of the B-format and where the angles $\theta_i$ and $\Phi_i$ correspond to an estimated source direction. FIG. 8 is an illustrative drawing representing the B-format ambisonic spatial format. Consider the first-order ambisonic encoding equations, whereby a source S at angle ($\theta$, $\Phi$) is encoded into the B-format (in FuMa representation) as follows:

$$W = S \cdot \frac{1}{\sqrt{2}} \qquad (22)$$
$$X = S \cdot \cos\theta \cos\phi$$
$$Y = S \cdot \sin\theta \cos\phi$$
$$Z = S \cdot \sin\phi$$

The encoding equations correspond to the directivity patterns of the B-format components. In an example B-format encoder, the output format direction vectors are constructed in accordance with the B-format encoding equations.

In some examples, the encoder matrix $H_A$ may be smoothed across time to reduce artifacts. In some examples, the encoder matrix $H_A$ may be smoothed across frequency to reduce artifacts. In some examples, the encoder matrix may be smoothed across time and frequency to reduce artifacts. As an example of smoothing across time, a smoothed encoder matrix $\hat{H}_A(b, t)$ to be used for encoding for frequency bin k at time t may be formed as a combination of the encoder matrix $H_A(k, t)$ specified in Eq. (19) and a smoothed encoder matrix $\hat{H}_A(k, t-1)$ for bin k at a preceding time t−1, for instance as $\hat{H}_A(k, t)=\lambda\hat{H}_A(k, t-1)+(1-\lambda)H_A(k, t)$ where $\lambda$ may be referred to as a smoothing parameter or a forgetting factor.

In operation, an example active signal encoder 608 determines an active output spatial audio signal vector $\vec{y}_A$ representing the active output signal component 609-1 according to the matrix multiplication operation $$\vec{y}_A = H_A \vec{x}_A \qquad (23)$$

which is carried out for each frequency bin. In cases where smoothing of the active encoder matrix is incorporated to reduce artifacts, the active output signal component may be determined as $\vec{y}_A = \hat{H}_A \vec{x}_A$. Those of ordinary skill in the art will understand that such a smoothed active encoder matrix may be readily used in the active encoding process instead of the encoder matrix specified in Eq. (19).

Passive Signal Encoder Configuration

For the passive encoder in the proposed spatial audio capture and encoding scheme, the design objective is to determine a static matrix $H_P$ that linearly combines the input microphone signals to approximate the signals corresponding to a capture in the desired encoding format, for example the ambisonic B-format. The matrix $H_P$ is applied to the passive input component vector $\vec{x}_P$ to determine the passive output component vector $\vec{y}_P$:

$$\vec{y}_P = H_P \vec{x}_P = \begin{bmatrix} \vdots \\ \vec{\alpha}_i^T \\ \vdots \end{bmatrix} \vec{x}_P \qquad (24)$$

For the case of B-format encoding, the passive encoding matrix $H_P$ is of size 4×M; it maps from M input channels (microphone signals) to 4 B-format output channels (W, X, Y, Z). A given row of $H_P$ consists of coefficients for linearly combining the elements of the passive input component vector to form one respective element of the passive output component vector. Each row of $H_p$ is a beamformer coefficient vector of size M×1. For instance, the i-th row corresponds to a beamformer coefficient vector $\vec{\alpha}_i$ such that the i-th element of the output vector $\vec{y}_p$ is given by $\vec{\alpha}_i^T \vec{x}_P$. For the example of B-format encoding, each row $\vec{\alpha}_i^T$ of the matrix $H_p$ is a beamformer for combining the device's microphones to form the corresponding B-format beam pattern, i.e. row 1 is the W component beamformer, row 2 forms the X component, and so on. These passive decoder static beamformers can be computed offline based on the calibration data as described below.

Given the estimated spatial responses G(f, $\Omega$) in the calibration data matrix $\Gamma$(f) and a target response B(f, $\Omega$)

such as an ideal B-format component response, a least-squares approach can be used to derive the optimal passive beamformers $\vec{\alpha}_i^T$ for combining the capture device's microphone signals to achieve the desired target beam patterns; such least-squares design approaches have been considered previously in the literature. See, Daniel et al., Theory and Design Refinement of High Order Ambisonic Microphones—Experiments with $4^{th}$ Order prototype, AES $23^{rd}$ International conference 2003; Parra, Least squares frequency-invariant beamforming, IEEE Workshop on Applications of Signal Processing and Audio and Acoustics, 2005. For each frequency f, samples of the target or desired response for the angle pairs $\Omega_i$ are used to construct a C×1 vector B(f, $\Omega_c$); the data matrix Γ(f) from the calibration is a C×M matrix. The design objective is then to find an M×1 vector of beamforming coefficients $\vec{\alpha}$(f) that satisfies $$\vec{B} = \Gamma \vec{\alpha} \tag{25}$$

in a least-squares sense, such that the corresponding linear combination of the column responses of matrix Γ approximates the target response vector $\vec{B}$, where the frequency dependence has again been omitted to simplify the notation. The standard solution is $$\vec{\alpha} = (\Gamma^H \Gamma)^{-1} \Gamma^H \vec{B} \tag{26}$$

The optimization in Eq (25) provides beamforming coefficients at frequency f for approximating the target beam pattern $\vec{B}$; the optimization is carried out for each target beam pattern, in other words each B-format component. The component optimizations are then used to construct the passive encoder matrix $H_P$ as indicated in Eq. (24). This process is carried out for all frequencies in the operating range. The optimization results can be smoothed across frequency such that each target component beamformer corresponds to a set of robust broadband beamforming filters for approximating the target beam pattern across the frequency range of interest.

In practice, the least-squares approach can be prone to inaccuracies; instability, and noise amplification. These limitations motivate the adoption of the proposed hybrid beamforming/encoding approach and the use of a least-squares passive beamformer/encoder only for residual signal components not encoded by the active beamforming/encoding process. It should be noted that application of a passive beamformer/encoder to the residual ensures that all of the captured audio scene content is encoded into the B-format; if a point source is inadvertently excluded from the active component it will still be encoded via the passive-component processing.

Processing Logic for Active/Passive Encoding

Computational costs associated with an encoding system determining active signal content can be significant. In some operational scenarios, there can be frequency bins in which detecting directional sources is less important than in other frequency bins. For instance, it may not be important to detect sources in a frequency bin in which the signal has energy less than a certain threshold. In one example, the threshold may be a fixed energy threshold. In one example, the threshold for a given frequency bin may be an adaptive energy threshold based on measurements of the signal energy in other frequency bins. In one example, the threshold for a given frequency bin may be an adaptive energy threshold based on measurements of the signal energy in the same frequency bin at previous time instants. In one example, the threshold for a given frequency bin may be an adaptive energy threshold based on measurements of the signal energy across frequency bin and time. To save computational resources, active signal processing can be bypassed for frequency bins of an input signal in which determination of active signal components is less important as explained above, for example. Moreover, in some computational scenarios, energy consumption considerations influence the number of frequency bins processed to detect active signal components. More particularly, in an example encoding system, the number of frequency bins processed to detect active signal components can be scaled based upon energy consumption factors (e.g., battery life). For example, computational scalability is used to achieve one or more of (1) statically reducing the computation on a given device, for instance to meet a processing budget constraint, (2) adaptively reducing the computation when other applications need processing power, (3) adaptively reducing the computation to improve battery life. In some examples, frequency bins which are not processed to detect active signal components are processed exclusively by a passive encoder.

In some examples, one or more frequency bins in the frequency partition may be designated as statically passive, for example in order to limit the computational cost of the algorithm by not carrying out the full processing for bins where it may not be as perceptually important as for other bins. For example, some of the extreme high or low frequency bins can be designated to be processed passively at all times.

In some encoder examples, the active and passive signal components determined by the subspace decomposition can be modified by a mixing process, for instance to reduce artifacts. Mathematically, the active-passive decomposition can be expressed as a matrix multiplication to determine one component and a subtraction to determine the other components. For instance, an example active component is derived as a matrix $\Phi_A = (G^H G)^{-1} G^H$ applied to the input signal (the active subspace projection matrix) and the passive component is derived via subtraction as follows. A portion of the passive component can then be added to the active component in a mixing process:

$$\text{Active Component: } \vec{x}_A = \Phi_A \vec{x} \tag{27}$$

$$\text{Passive Component: } \vec{x}_P = \vec{x} - \vec{x}_A = (I - \Phi_A)\vec{x} \tag{28}$$

$$\text{Active Component with Passive Mix: } \vec{x}_A = \vec{x}_A + \epsilon \vec{x}_P \tag{29}$$

$$\text{Passive Component with Passive mix: } \vec{x}_P = (1-\epsilon)\vec{x}_P \tag{30}$$

This can be mathematically reformulated as $$\vec{x}_A = (\epsilon I + (1-\epsilon)\Phi_A)\vec{x} \tag{31}$$

$$\vec{x}_P = \vec{x} - \vec{x}_A. \tag{32}$$

Alternatively, the passive component is derived as a matrix applied to the input signal (where the applied matrix is the identity matrix minus the active subspace projection matrix) and the active component is derived by subtraction as follows. A portion of the active component can then be added to the passive component in a mixing process:

$$\text{Passive Component: } \vec{x}_P = \Phi_P \vec{x} \tag{33}$$

$$\text{Active Component: } \vec{x}_A = \vec{x} - \vec{x}_P = (I - \Phi_P)\vec{x} \tag{34}$$

Passive Component with Active Mix: $\vec{x}_P = \vec{x}_P + \epsilon \vec{x}_A$ (35)

Active Component with Active mix: $\vec{x}_A = (1-\epsilon)\vec{x}_A$ (36)

This can be mathematically reformulated as, $$\vec{x}_P = (\epsilon I + (1-\epsilon)\Phi_P)\vec{x}$$ (37)

$$\vec{x}_A = \vec{x} - \vec{x}_P.$$ (38)

In some examples, the mixing process is used to reduce the perceptibility of artifacts. In some examples, the mixing processing can be used to redirect certain components to the passive encoder.

Example Hardware Implementation

Figure 9:
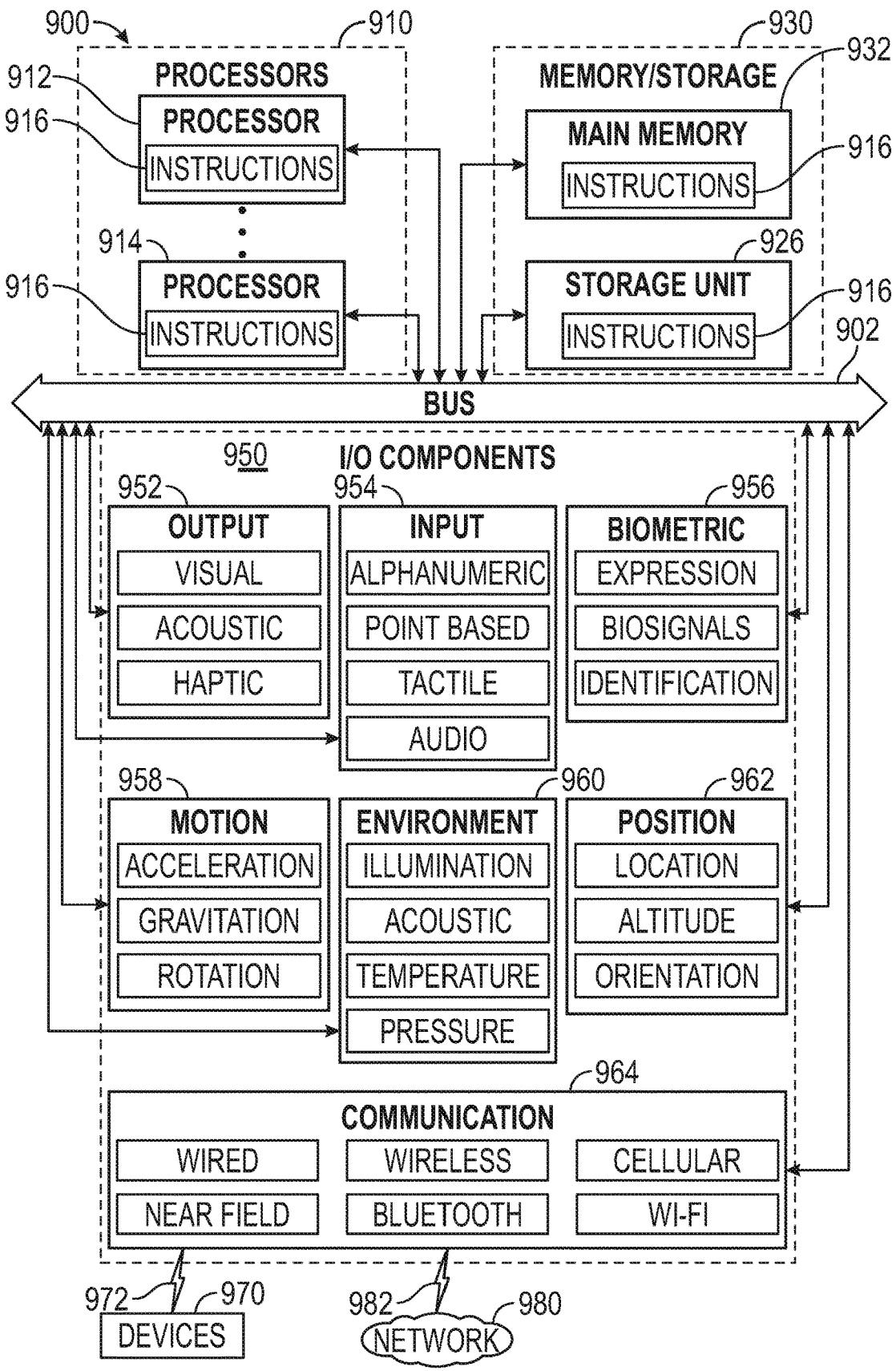
FIG. 9 is an illustrative block diagram illustrating components of a machine, according to some example embodiments, able to read instructions from a machine-readable medium (e.g., a machine-readable storage medium) and perform any one or more of the methodologies discussed herein.

FIG. 9 is an illustrative block diagram illustrating components of a machine 900, according to some example embodiments, able to read instructions 916 from a machine-readable medium (e.g., a machine-readable storage medium) and perform any one or more of the methodologies discussed herein. Specifically, FIG. 9 shows a diagrammatic representation of the machine 900 in the example form of a computer system, within which the instructions 916 (e.g., software, a program, an application, an applet, an app, or other executable code) for causing the machine 900 to perform any one or more of the methodologies discussed herein may be executed. For example, the instructions 916 can configure one or more processor devices 910 to implement the encoder 106 of FIG. 1, the decoder system 600 of FIG. 6 and the modules of FIG. 7, for example. The instructions 916 can transform the general, non-programmed machine 900 into a particular machine programmed to carry out the described and illustrated functions in the manner described (e.g., as an audio processor circuit). In alternative embodiments, the machine 900 operates as a standalone device or can be coupled (e.g., networked) to other machines. In a networked deployment, the machine 900 can operate in the capacity of a server machine or a client machine in a server-client network environment, or as a peer machine in a peer-to-peer (or distributed) network environment.

The machine 900 can comprise, but is not limited to, a server computer, a client computer, a personal computer (PC), a tablet computer, a laptop computer, a netbook, a set-top box (STB), a personal digital assistant (PDA), an entertainment media system or system component, a cellular telephone, a smart phone, a mobile device, a wearable device (e.g., a smart watch), a smart home device (e.g., a smart appliance), other smart devices, a web appliance, a network router, a network switch, a network bridge, a headphone driver, or any machine capable of executing the instructions 916, sequentially or otherwise, that specify actions to be taken by the machine 900. Further, while only a single machine 900 is illustrated, the teen "machine" shall also be taken to include a collection of machines 900 that individually or jointly execute the instructions 916 to perform any one or more of the methodologies discussed herein.

The machine 900 can include or use processors 910, such as including an audio processor circuit, non-transitory memory/storage 930, and 110 components 950, which can be configured to communicate with each other such as via a bus 902. In an example embodiment, the processors 910 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) can include, for example, a circuit such as a processor 912 and a processor 914 that may execute the instructions 916. The term "processor" is intended to include a multi-core processor 912, 914 that can comprise two or more independent processors 911, 914 (sometimes referred to as "cores") that may execute the instructions 916 contemporaneously. Although FIG. 9 shows multiple processors 910, the machine 900 may include a single processor 912, 914 with a single core, a single processor 911, 914 with multiple cores (e.g., a multi-core processor 912, 914), multiple processors 912, 914 with a single core, multiple processors 912, 914 with multiples cores, or any combination thereof, wherein any one or more of the processors can include a circuit configured to apply a height filter to an audio signal to render a processed or virtualized audio signal.

The memory/storage 930 can include a memory 932, such as a main memory circuit, or other memory storage circuit, and a storage unit 936, both accessible to the processors 910 such as via the bus 902. The storage unit 936 and memory 932 store the instructions 916 embodying any one or more of the methodologies or functions described herein. The instructions 916 may also reside, completely or partially, within the memory 932, within the storage unit 936, within at least one of the processors 910 (e.g., within the cache memory of processor 912, 914), or any suitable combination thereof, during execution thereof by the machine 900. Accordingly, the memory 932, the storage unit 936, and the memory of the processors 910 are examples of machine-readable media.

As used herein, "machine-readable medium" means a device able to store the instructions 916 and data temporarily or permanently and may include, but not be limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 916. The term "machine-readable medium" shall also be taken to include any medium, or combination of multiple media, that is capable of storing instructions (e.g., instructions 916) for execution by a machine (e.g., machine 900), such that the instructions 916, when executed by one or more processors of the machine 900 (e.g., processors 910), cause the machine 900 to perform any one or more of the methodologies described herein. Accordingly, a "machine-readable medium" refers to a single storage apparatus or device, as well as "cloud-based" storage systems or storage networks that include multiple storage apparatus or devices. The tell "machine-readable medium" excludes signals per se.

The I/O components 950 may include a variety of components to receive input, provide output, produce output, transmit information, exchange information, capture measurements, and so on. The specific I/O components 950 that are included in a particular machine 900 will depend on the type of machine 900. For example, portable machines such as mobile phones will likely include a touch input device or other such input mechanisms, while a headless server machine will likely not include such a touch input device. It will be appreciated that the I/O components 950 may include many other components. The I/O components 950 are grouped by functionality merely for simplifying the following discussion, and the grouping is in no way limiting. In various example embodiments, the I/O components 950 may include output components 952 and input components 954. The output components 952 can include visual components (e.g., a display such as a plasma display panel (PDP), a light emitting diode (LED) display, a liquid crystal display (LCD), a projector, or a cathode ray tube (CRT)), acoustic components (e.g., loudspeakers), haptic components (e.g., a vibratory motor, resistance mechanisms), other signal generators, and so forth. The input components 954 can include alphanumeric input components (e.g., a keyboard a touch screen configured to receive alphanumeric input, a photo-optical keyboard, or other alphanumeric input components), point based input components (e.g., a mouse, a touchpad, a trackball, a joystick, a motion sensor, or other pointing instruments), tactile input components (e.g., a physical button, a touch screen that provides location and/or force of touches or touch gestures, or other tactile input components), audio input components (e.g., a microphone), and the like.

In further example embodiments, the I/O components 950 can include biometric components 956, motion components 958, environmental components 960, or position components 962, among a wide array of other components. For example, the biometric components 956 can include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like, such as can influence a inclusion, use, or selection of a listener-specific or environment-specific impulse response or HRTF, for example. In an example, the biometric components 956 can include one or more sensors configured to sense or provide information about a detected location of the listener in an environment. The motion components 958 can include acceleration sensor components (e.g., accelerometer), gravitation sensor components, rotation sensor components (e.g., gyroscope), and so forth, such as can be used to track changes in the location of the listener. The environmental components 960 can include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect reverberation decay times, such as for one or more frequencies or frequency bands), proximity sensor or room volume sensing components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 962 can include location sensor components (e.g., a Global Position System (GPS) receiver component), altitude sensor components (e.g., altimeters or barometers that detect air pressure from which altitude may be derived), orientation sensor components (e.g., magnetometers), and the like.

Communication can be implemented using a wide variety of technologies. The I/O components 950 can include communication components 964 operable to couple the machine 900 to a network 980 or devices 970 via a coupling 982 and a coupling 972 respectively. For example, the communication components 964 can include a network interface component or other suitable device to interface with the network 980. In further examples, the communication components 964 can include wired communication components, wireless communication components, cellular communication components, near field communication (NFC) components, Bluetooth® components (e.g., Bluetooth® Low Energy), Wi-Fi® components, and other communication components to provide communication via other modalities. The devices 970 can be another machine or any of a wide variety of peripheral devices (e.g., a peripheral device coupled via a USB).

Moreover, the communication components 964 can detect identifiers or include components operable to detect identifiers. For example, the communication components 964 can include radio frequency identification (RFID) tag reader components, NEC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF49, Ultra Code, UCC RSS-2D bar code, and other optical codes), or acoustic detection components (e.g., microphones to identify tagged audio signals). In addition, a variety of information can be derived via the communication components 1064, such as location via Internet Protocol (IP) geolocation, location via Wi-Fi® signal triangulation, location via detecting an NFC beacon signal that may indicate a particular location, and so forth. Such identifiers can be used to determine information about one or more of a reference or local impulse response, reference or local environment characteristic, or a listener-specific characteristic.

In various example embodiments, one or more portions of the network 980 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 980 or a portion of the network 980 can include a wireless or cellular network and the coupling 982 may be a Code Division Multiple Access (CDMA) connection, a Global System for Mobile communications (GSM) connection, or another type of cellular or wireless coupling. In this example, the coupling 1482 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology. In an example, such a wireless communication protocol or network can be configured to transmit headphone audio signals from a centralized processor or machine to a headphone device in use by a listener.

The instructions 916 can be transmitted or received over the network 980 using a transmission medium via a network interface device (e.g., a network interface component included in the communication components 964) and using any one of a number of well-known transfer protocols (e.g., hypertext transfer protocol (HTTP)). Similarly, the instructions 916 can be transmitted or received using a transmission medium via the coupling 972 (e.g., a peer-to-peer coupling) to the devices 970. The term "transmission medium" shall be taken to include any intangible medium that is capable of storing, encoding, or carrying the instructions 916 for execution by the machine 900, and includes digital or analog communications signals or other intangible media to facilitate communication of such software.

Various Examples Including Encoders, Methods of Encoding and Articles of Manufacture Example 1 can include or use subject matter for use with an audio capture device that includes multiple microphones having a spatial arrangement on the device, the subject matter including an audio signal encoder comprising: a processor and a non-transitory computer readable medium operably coupled thereto, the non-transitory computer readable medium comprising a plurality of instructions stored in association therewith that are accessible to, and executable by, the processor, where the plurality of instructions comprises: instructions that, when executed, determine a number and directions of arrival of directional audio sources represented in the one or more microphone signals having the microphone spatial format; instructions that when executed, determine one of an active microphone signal component and a passive microphone signal component, based upon the determined number and direction of arrival of the audio sources represented in the one or more microphone signals having the microphone spatial format; instructions that, when executed, determine the other of the active microphone signal component and the passive microphone signal component, based upon the determined one of the active spatial audio input signal component and the passive spatial audio input signal component; instructions that, when executed, encode the active microphone signal component to a first output signal having a first spatial output format; instructions that, when executed, encode the passive microphone signal component to a second output signal having a second spatial output format.

Example 2 can include the subject matter of Example 1 wherein the first spatial output format is different from the second spatial output format.

Example 3 can include the subject matter of Example 1 wherein the first output format matches the second spatial output format.

Example 4 can include the subject matter of Example 1 wherein the microphone spatial format corresponds to a spatial arrangement of the multiple microphones relative to a reference microphone at the device.

Example 5 can include the subject matter of Example 1 wherein the instructions that, when executed to determine a number and direction of arrival of directional audio sources, determine a subspace of a codebook corresponding to one or more direction vectors of the codebook to represent the microphone signals.

Example 6 can include the subject matter of Example 1 wherein the instructions that, when executed to determine a number and direction of arrival of directional audio sources, determine a subspace of a codebook corresponding to one or more direction vectors of the codebook to represent the microphone signals, based upon an optimality metric computed for direction vectors within the codebook.

Example 7 can include the subject matter of Example 6 wherein the optimality metric includes one or more correlations between direction vectors within the codebook and one or more eigenvectors of a noise subspace of the input spatial audio signal.

Example 8 can include the subject matter of Example 6 wherein the optimality metric includes a correlation between direction vectors within the codebook and the input spatial audio signal.

Example 9 can include the subject matter of Example 1 wherein the instructions that, when executed to determine a number and directions of arrival of directional audio sources, determine a subspace of a codebook corresponding to one or more direction vectors of the codebook to represent the spatial microphone signals; and wherein the instructions that, when executed to determine one of an active microphone signal component and a passive microphone signal component, determine based upon a mapping of the microphone signals onto the determined subspace of the codebook corresponding to the one or more direction vectors of the codebook.

Example 10 can include the subject matter of Example 1 wherein the instructions that, when executed to determine one of the active microphone signal component and the passive microphone signal component, determine the active microphone signal component; and wherein the instructions that when executed, determine the other of the active microphone signal component and the passive microphone signal component based upon the determined one of the active microphone signal component and the passive microphone signal component;

Example 11 can include the subject matter of Example 1 further including: instructions that, when executed, convert the microphone signals from a time-domain representation to a time-frequency representation; and instructions that, when executed, convert the first output signal having the first output format and the second output signal having the second output format from the time-frequency representation to the time-domain representation.

Example 12 can include the subject matter of Example 1 further including: instructions that, when executed, combine the first output signal having the first output format and the second output signal having the second output format.

Example 13 can include the subject matter of Example 1 wherein at least one of the first spatial output format and the second spatial output format includes an ambisonic format.

Example 14 can include or use subject matter for use with an audio capture device that includes multiple microphones having a spatial arrangement on the device, the subject matter including a method to encode audio signals comprising: receiving multiple microphone signals corresponding to the multiple microphones; determining a number and directions of arrival of directional audio sources represented in the one or more microphone signals having the microphone spatial format; determining one of an active microphone signal component and a passive microphone signal component, based upon the determined number and direction of arrival of the audio sources represented in the one or more microphone signals having the microphone spatial format; determining the other of the active microphone signal component and the passive microphone signal component, based upon the determined one of the active input spatial audio signal component and the passive input spatial audio input component; encoding the active microphone signal component to a first output signal having a first spatial output fauna; encoding the passive microphone signal component to a second output signal having a second spatial output format.

Example 15 can include the subject matter of Example 14 wherein the first output form at is different from the second output format.

Example 16 can include the subject matter of Example 14 wherein the first output format matches the second output format.

Example 17 can include the subject matter of Example 14 wherein the microphone spatial format corresponds to a spatial arrangement of the multiple microphones relative to a reference microphone at the device.

Example 18 can include the subject matter of Example 14 wherein determining the number and directions of arrival of directional audio sources includes determining a subspace of a codebook corresponding to one or more direction vectors of the codebook to represent the microphone signals.

Example 19 can include the subject matter of Example 14 further including: determining a number and directions of arrival of directional audio sources includes determining a subspace of a codebook corresponding to one or more direction vectors of the codebook to represent the microphone signals, based upon an optimality metric computed for direction vectors within the codebook.

Example 20 can include the subject matter of Example 19 wherein the optimality metric includes one or more correlations between direction vectors within the codebook and one or more eigenvectors of a noise subspace of the input spatial audio signal.

Example 21 can include the subject matter of Example 19 wherein the optimality metric includes a correlation between direction vectors within the codebook and the input spatial audio signal.

Example 22 can include the subject matter of Example 14 wherein determining a number and directions of arrival of directional audio sources includes determining a subspace of a codebook corresponding to one or more direction vectors of the codebook to represent the spatial microphone signals; and wherein determining one of an active microphone signal component and a passive microphone signal component includes determining based upon a mapping of the microphone signals onto the determined subspace of the codebook corresponding to the one or more direction vectors of the codebook.

Example 23 can include the subject matter of Example 14 wherein the instructions that when executed to determine one of the active microphone signal component and the passive microphone signal component, determine the active microphone signal component; and wherein the instructions that when executed, determine the other of the active microphone signal component and the passive microphone signal component based upon the determined one of the active microphone signal component and the passive microphone signal component;

Example 24 can include the subject matter of Example 14 further including: converting the microphone signals from a time-domain representation to a time-frequency representation; and converting the first output signal having the first output format and the second output signal having the second output format from the time-frequency representation to the time-domain representation.

Example 25 can include the subject matter of Example 14 further including: combining the first output signal having the first output format and the second output signal having the second output format.

Example 26 can include the subject matter of Example 14 wherein at least one of the first spatial output format and the second spatial output format includes an ambisonic format.

Example 27 can include or use subject matter that includes an article of manufacture including a non-transitory machine-readable storage medium including instructions that, when executed by a machine, cause the machine to perform a method for use with an audio capture device that includes multiple microphones having a spatial arrangement on the device, to encode audio signals, the method comprising: receiving multiple microphone signals corresponding to the multiple microphones; determining a number and directions of arrival of directional audio sources represented in the one or more microphone signals having the microphone spatial format; determining one of an active microphone signal component and a passive microphone signal component, based upon the determined number and directions of arrival of the audio sources represented in the one or more microphone signals having the microphone spatial format; determining the other of the active microphone signal component and the passive microphone signal component, based upon the determined one of the active input spatial audio signal component and the passive input spatial audio signal component; encoding the active microphone signal component to a first output signal having a first spatial output format; encoding the passive microphone signal component to a second output signal having a second spatial output format.

Example 28 can include the subject matter of Example 27 wherein the first output format is different from the second output format.

Example 29 can include the subject matter of Example 27 wherein the first output format matches the second output format.

Example 30 can include the subject matter of Example 27 wherein the microphone spatial format corresponds to a spatial arrangement of the multiple microphones relative to a reference microphone at the device.

Example 31 can include the subject matter of Example 27 wherein determining the number and directions of arrival of directional audio sources includes determining a subspace of a codebook corresponding to one or more direction vectors of the codebook to represent the microphone signals.

Example 32 can include the subject matter of Example 27 further including: determining a number and directions of arrival of directional audio sources includes determining a subspace of a codebook corresponding to one or more direction vectors of the codebook to represent the microphone signals, based upon an optimality metric computed for directions within the codebook.

Example 33 can include the subject matter of Example 32 wherein the optimality metric includes one or more correlations between direction vectors within the codebook and one or more eigenvectors of a noise subspace of the input spatial audio signal.

Example 34 can include the subject matter of Example 32 wherein the optimality metric includes a correlation between direction vectors within the codebook and the input spatial audio signal.

Example 35 can include the subject matter of Example 27 wherein determining a number and direction of arrival of directional audio sources includes determining a subspace of a codebook corresponding to one or more direction vectors of the codebook to represent the spatial microphone signals; and wherein determining one of an active microphone signal component and a passive microphone signal component includes determining based upon a mapping of the microphone signals onto the determined subspace of the codebook corresponding to the one or more direction vectors of the codebook.

Example 36 can include the subject matter of Example 27 wherein the instructions that when executed to determine one of the active microphone signal component and the passive microphone signal component, determine the active microphone signal component; and wherein the instructions that when executed, determine the other of the active microphone signal component and the passive microphone signal component based upon the determined one of the active microphone signal component and the passive microphone signal component;

Example 37 can include the subject matter of Example 27 further including: converting the microphone signals from a time-domain representation to a time-frequency representation; and converting the first output signal having the first output format and the second output signal having the second output format from the time-frequency representation to the time-domain representation.

Example 38 can include the subject matter of Example 27 further including: combining the first output signal having the first output format and the second output signal having the second output format.

Example 39 can include the subject matter of Example 27 wherein at least one of the first spatial output format and the second spatial output format includes an ambisonic format.

Example 40 can include or use subject matter that includes an audio signal encoder for use for use with an audio capture device that includes multiple microphones having a spatial arrangement on the device, the audio signal encoder comprising: means for determining a number and directions of arrival of directional audio sources represented in the one or more microphone signals having the microphone spatial format; means for determining one of an active microphone signal component and a passive microphone signal component, based upon the determined number and directions of arrival of the audio sources represented in the one or more microphone signals having the microphone spatial format; means for determining the other of the active microphone signal component and the passive microphone signal component; based upon the determined one of the active input spatial audio signal component and the passive input spatial audio signal component; means for encoding the active microphone signal component to a first output signal having a first spatial output format; means for encoding the passive microphone signal component to a second output signal having a second spatial output format.

Example 41 can include the subject matter of Example 40 wherein the first spatial output format is different from the second spatial output format.

Example 42 can include the subject matter of Example 40 wherein the first spatial output format matches the second spatial output format.

Example 43 can include the subject matter of Example 40 wherein the microphone spatial format corresponds to a spatial arrangement of the multiple microphones relative to a reference microphone at the device.

Example 44 can include the subject matter of Example 40 wherein the means for determining a number and directions of arrival of directional audio sources, determines a subspace of a codebook corresponding to one or more direction vectors of the codebook to represent the microphone signals.

Example 45 can include the subject matter of Example 40 wherein the means for determining a number and directions of arrival of directional audio sources, determines a subspace of a codebook corresponding to one or more direction vectors of the codebook to represent the microphone signals, based upon an optimality metric computed for directions within the codebook.

Example 46 can include the subject matter of Example 45 wherein the optimality metric includes one or more correlations between direction vectors within the codebook and one or more eigenvectors of a noise subspace of the input spatial audio signal.

Example 47 can include the subject matter of Example 45 wherein the optimality metric includes a correlation between direction vectors within the codebook and the input spatial audio signal.

Example 48 can include the subject matter of Example 40 wherein the means for determining a number and directions of arrival of directional audio sources, determine a subspace of a codebook corresponding to one or more direction vectors of the codebook to represent the spatial microphone signals; and wherein the means for determining one of an active microphone signal component and a passive microphone signal component, determine based upon a mapping of the microphone signals onto the determined subspace of the codebook corresponding to the one or more direction vectors of the codebook.

Example 49 can include the subject matter of Example 40 wherein the means for determining one of the active microphone signal component and the passive microphone signal component, determine the active microphone signal component; and wherein the means for determining the other of the active microphone signal component and the passive microphone signal component based upon the determined one of the active microphone signal component and the passive microphone signal component;

Example 50 can include the subject matter of Example 40 further including: means for converting the microphone signals from a time-domain representation to a time-frequency representation; and means for converting the first output signal having the first output format and the second output signal having the second output format from the time-frequency representation to the time-domain representation.

Example 51 can include the subject matter of Example 40 further including means for combining the first output signal having the first output format and the second output signal having the second output format.

Example 52 can include the subject matter of Example 40 wherein at least one of the first spatial output format and the second spatial output format includes an ambisonic format.

While the above detailed description has shown, described, and pointed out novel features as applied to various examples, it will be understood that various omissions, substitutions, and changes in the form and details of the devices or algorithms illustrated can be made without departing from the scope of the disclosure. As will be recognized, certain embodiments of the inventions described herein can be embodied within a form that does not provide all of the features and benefits set forth herein, as some features can be used or practiced separately from others.

Moreover, although the subject matter has been described in language specific to structural features and methodological acts, it is to be understood that the subject matter defined in the appended claims is not necessarily limited to the specific features or acts described above. Rather, the specific features and acts described above are disclosed as example forms of implementing the claims.

What is claimed is:

1. For use with an audio capture device that includes multiple microphones on the audio capture device, an audio signal encoder comprising:
- a processor and a non-transitory computer readable medium operably coupled thereto, the non-transitory computer readable medium comprising a plurality of instructions stored in association therewith that are accessible to, and executable by, the processor, where the plurality of instructions comprises:
- instructions that, when executed, determine a number and direction of arrival of directional audio sources represented in one or more microphone signals having a microphone spatial format;
- instructions that when executed, determine one of an active microphone signal component and a passive microphone signal component, based upon the number and direction of arrival of directional audio sources represented in the one or more microphone signals having the microphone spatial format;
- instructions that when executed, determine the other of the active microphone signal component and the passive microphone signal component;
- instructions that when executed, encode the active microphone signal component, to a first output signal having a first spatial output format;
- instructions that when executed, encode the passive microphone signal component, to a second output signal having a second spatial output format.

2. The audio signal encoder of claim 1, wherein the first spatial output format is different from the second spatial output format.

3. The audio signal encoder of claim 1, wherein the first spatial output format matches the second spatial output format.

4. The audio signal encoder of claim 1, wherein the microphone spatial format corresponds to a spatial arrangement of the multiple microphones relative to a reference microphone at the audio capture device.

5. The audio signal encoder of claim 1, wherein the instructions that, when executed to determine the number and direction of arrival of directional audio sources, determine a subspace of a codebook corresponding to one or more direction vectors of the codebook to represent the one or more microphone signals.

6. The audio signal encoder of claim 1,
wherein the instructions that, when executed to determine the number and direction of arrival of directional audio sources, determine a subspace of a codebook corresponding to one or more direction vectors of the codebook to represent the one or more microphone signals, based upon an optimality metric computed for direction vectors within the codebook.

7. The audio signal encoder of claim 6, wherein the optimality metric includes one or more correlations between direction vectors within the codebook and one or more eigenvectors of a noise subspace of the one or more microphone signals.

8. The audio signal encoder of claim 6, wherein the optimality metric includes a correlation between direction vectors within the codebook and the one or more microphone signals.

9. The audio signal encoder of claim 1,
wherein the instructions that, when executed to determine the number and direction of arrival of directional audio sources, determine a subspace of a codebook corresponding to one or more direction vectors of the codebook to represent the one or more microphone signals; and
wherein the instructions that, when executed to determine one of the active microphone signal component and the passive microphone signal component, determine based upon a mapping of the microphone signals onto the subspace of the codebook corresponding to the one or more direction vectors of the codebook.

10. The audio signal encoder of claim 1,
wherein the instructions that when executed to determine one of the active microphone signal component and the passive microphone signal component, determine the active microphone signal component.

11. The audio signal encoder of claim 1 further including:
instructions that, when executed, convert the one or more microphone signals from a time-domain representation to a time-frequency representation; and
instructions that, when executed, convert the first output signal having the first spatial output format and the second output signal having the second spatial output format from the time-frequency representation to the time-domain representation.

12. The audio signal encoder of claim 1 further including:
instructions that, when executed, combine the first output signal having the first spatial output format and the second output signal having the second spatial output format.

13. The audio signal encoder of claim 1,
wherein at least one of the first spatial output format and the second spatial output format includes an ambisonic format.

14. For use with an audio capture device that includes multiple microphones on the audio capture device, a method to encode audio signals comprising:
- receiving multiple microphone signals corresponding to the multiple microphones;
- determining a number and direction of arrival of directional audio sources represented in the multiple microphone signals having a microphone spatial format;
- determining one of an active microphone signal component and a passive microphone signal component, based upon the number and direction of arrival of directional audio sources represented in the multiple microphone signals having the microphone spatial format;
- determining the other of the active microphone signal component and the passive microphone signal component;
- encoding the active microphone signal component, to a first output signal having a first spatial output format;
- encoding the passive microphone signal component, to a second output signal having a second spatial output format.

15. The method of claim 14,
wherein the first spatial output format is different from the second spatial output format.

16. The method of claim 14,
wherein the first spatial output format matches the second spatial output format.

17. The method of claim 14, wherein the microphone spatial format corresponds to a spatial arrangement of the multiple microphones relative to a reference microphone at the audio capture device.

18. The method of claim 14, wherein determining the number and direction of arrival of directional audio sources includes determining a subspace of a codebook corresponding to one or more direction vectors of the codebook to represent the multiple microphone signals.

19. The method of claim 14, wherein determining the number and direction of arrival of directional audio sources includes determining a subspace of a codebook corresponding to one or more direction vectors of the codebook to represent the multiple microphone signals, based upon an optimality metric computed for direction vectors within the codebook.

20. The method of claim 19,
wherein the optimality metric includes one or more correlations between direction vectors within the codebook and one or more eigenvectors of a noise subspace of the multiple microphone signals.

21. The method of claim 19,
wherein the optimality metric includes a correlation between direction vectors within the codebook and the multiple microphone signals.

22. The method of claim 14,
wherein determining the number and direction of arrival of directional audio sources includes determining a subspace of a codebook corresponding to one or more direction vectors of the codebook to represent the multiple microphone signals; and
wherein determining one of the active microphone signal component and the passive microphone signal component includes determining based upon a mapping of the multiple microphone signals onto the determined subspace of the codebook corresponding to the one or more direction vectors of the codebook.

23. The method of claim 14,
wherein determining one of the active microphone signal component and the passive microphone signal component includes determining the active microphone signal component.

24. The method of claim 14 further including:
converting the multiple microphone signals from a time-domain representation to a time-frequency representation; and
converting the first output signal having the first spatial output format and the second output signal having the second spatial output format from the time-frequency representation to the time-domain representation.

25. The method of claim 14 further including:
combining the first output signal having the first spatial output format and the second output signal having the second spatial output format.

26. The method of claim 14,
wherein at least one of the first spatial output format and the second spatial output format includes an ambisonic format.

* * * * *